INVENTORS
DONALD L. SHORE
JAMES S. WARWICK
BY Thomas J. Nikolai
ATTORNEY

INVENTORS
DONALD L. SHORE
JAMES S. WARWICK
BY Thomas J. Nikolai
ATTORNEY

United States Patent Office 3,470,421

Patented Sept. 30, 1969

3,470,421

CONTINUOUS BUS BAR FOR CONNECTOR PLATE BACK PANEL MACHINE WIRING

Donald L. Shore, St. Paul, and James S. Warwick, Minneapolis, Minn., assignors to Sperry Rand Corporation, New York, N.Y., a corporation of Delaware Filed Aug. 30, 1967, Ser. No. 664,489
Int. Cl. H02b *1/04, 9/00*
U.S. Cl. 317—101 10 Claims

ABSTRACT OF THE DISCLOSURE

A continous bus bar for a conductive connector plate that is specifically designed for back-panel wiring by an automatic Wire-Wrap machine. The bus bar, on the connector plate front-side, includes a continuous spring clip for sliding pressure electrical contact with male contacts of printed circuit board connectors that are mounted thereby on the conector plate front-side. The bus bar, on the back-side, may include one or more conductive strips that are electrically coupled to the spring clip on the front-side by conductive members that, on the back-side, may also function as Wire-Wrap pins. The bus bar may be insulatively mounted on the connector plate to function as a voltage bus or may be directly mounted on the connector plate to function as a ground bus.

Background of the invention

The present invention relates to the electronic art and in particular to that part of the electronic art that relates to the support of and to the electrical interconnection of modular elecronic circuits that are mounted on plug-in type printed circuit boards. As the electronic components utilized in present day electronic data processing systems have, through micro-miniature techniques, been reduced in size a primary concern of electronic engineers is the efficient packaging of electronic circuits. As the size and cost of electronic circuits are substantial factors in the design of reliable electronic equipment, electronic engineers have attempted to reduce to a minimum the types of electronic circuits, or card types, that are utilized in any specific piece of equipment. These electronic circuits are mounted on plug-in type printed circuit boards of a modular construction providing lowered costs obtainable by mass production techniques while providing higher quality assurance and a greater ease of equipment maintainability.

These standardized modular electronic circuits, or card types, that are mounted on plug-in type printed circuit boards usually terminate in a plurality of male electrical connectors that are specifically designed to provide electrical interconnection with standard dimensioned female receptacles. The most efficient technique for the support and electrical interconnection of such modular printed circuit boards presently involves the utilization of a rather large planar panel on which are mounted a plurality of female receptacles arranged in a predetermined pattern. The female receptacles are mounted on the front-side of the mounting panel and provided support and electrical interconnection of the modular electronic circuits that are mounted on the plug-in type printed circuit boards. On the back-side of the panel the female receptacles terminate in an electrical conductive member that functions as a Wire-Wrap pin. The electrical interconnection, or back panel wiring, of these Wire-Wrap pins in accomplished by a wiring machine such as that produced by the Gardner-Denver Company, Grand Haven, Mich. For a discussion of such wiring technique see the publication "Wiring Terminal Panels by Machine," Control Engineering, August 191, pages 77–81. The control of such a Wire-Wrap machine is preferably under numerical control by a digital computer in an automated manufacturing system such as that disclosed in the copending patent application of J. P. Holmgren, et al., Ser. No. 323,969, now abandoned, Nov. 15, 1963, assigned to the Sperry Rand Corporation as is the present invention.

The center-to-center spacing of Wire-Wrap pins for automatic, or machine wiring, of electronic back panels has in prior art arrangements been successfully reduced from 0.25 inch to 0.125 inch. However, with a standard grid pattern of 0.10 inch being utilized in printed cricuit card layouts it is extremely desirable to reduce the center-to-center spacing of Wire-Wrap pins to a like dimension. However, in attempting to reduce such spacing to 0.10 inch excessive wire height build-up has occurred. Wire height build-up has been compounded by one prior practice of forming bus bars along the back panel by the electrical interconnection of like voltage level pins by individual conductors with the Wire-Wrap machine. Where voltage regulation along the bus bar is critical, due to the limited dimensions of the interconnecting wires it has been necessary to use a plurality of parallel arranged wire-wrap leads to maintain the proper current carrying capacities. As continuous strip bus bars have, in the past on such back panel wiring arrangements, been placed only on the back-side of the mounting panel conductive strips electrically interconnecting predetermined Wire-Wrap pins have, due to the small dimensions involved, been arranged in a stacked, but staggered, arrangement along adjoining lines of wire-wrap pins. However, the staggering of continuous strip bus bars along adjoining lines of wire-wrap pins places such bus bars at inordinately greater distances away from the back-side of such panel whereby, wires placed across such bus bars by the Wire-Wrap machine are placed under undue stress resulting in broken wires and shorting between the wire and the bus bar.

Summary of the invention

The present invention relates to a continuous strip bus bar for a conductive connector plate that is specifically designed for back panel wiring by an automatic Wire-Wrap machine under numerical control by an electronic data processing system. The conductive connector plate functions as an electro-magnetic shield or ground plane while having a pattern of holes therethrough in which are inserted, or mounted on the front-side, insulated pass-through female connectors. The connectors on the front-side serve as mounting means for the male blades of the printed circuit board connectors that are mounted thereon while on the back-side serve as Wire-Wrap pins for back panel wiring by the automated Wire-Wrap machine. The bus bar, on the connector plate front-side, includes a continuous spring clip for sliding pressure electrical contact with male contacts of printed circuit board connectors that are mounted thereby on the connector plate front-side. The bus bar, on the back-side, may include one or more conductive strips that are electrically coupled to the spring clip on the front-side by conductive members that on the back-side may also function as Wire-Wrap pins. The bus-bar may be insulatively mounted on the connector plate to function as a voltage bus or may be directly mounted on, i.e., electrically common to, the connector plate to function as a ground bus. As a voltage bus, high current carrying capacity is provided by mounting the continuous spring clip on a continuous conductive member thereby increasing the bus bar's cross sectional area. The continuous spring clip and conductive member on the panel, or connector plate, front-side are electrically in parallel with one or more continuous conductive members on the panel back-side whereby the voltage drop along the bus bar is reduced to a minimum due to the so-provided large cross-section continuous conductive members that make up the bus bar. One or more conductive members that are spaced along the bus bar which conductive members electrically interconnect through holes in the conductive plate, the spring clip on the panel front-side to the conductive members on the back-side, may also function as additional Wire-Wrap pins. Accordingly, it is a primary object of the present invention to provide an improved bus bar for back panel machine wiring.

Description of the preferred embodiment

Figure 1:
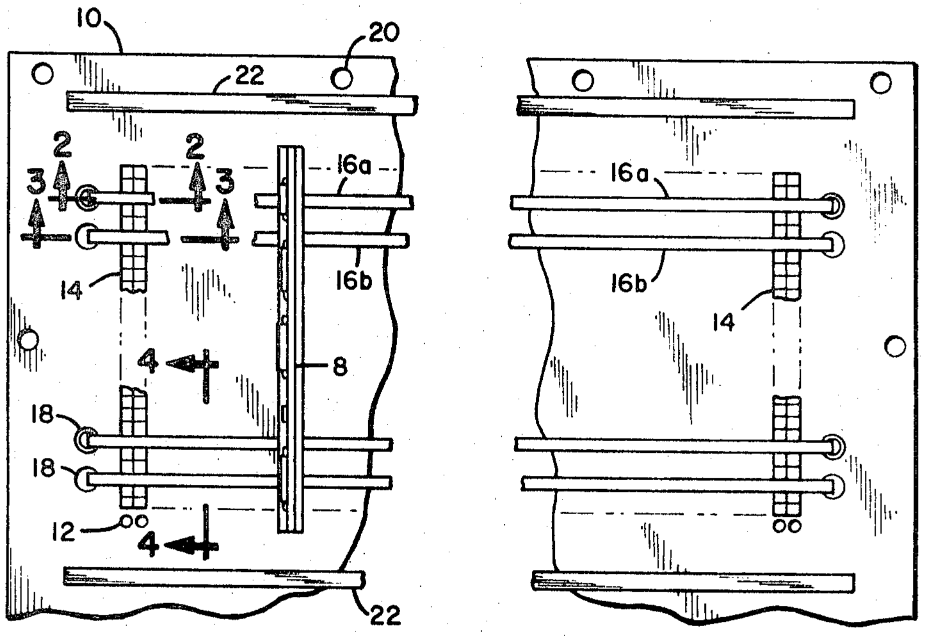
FIG. 1 is a partial plan view of the front side of a conductive connector plate on which is mounted the bus bar of the present invention.

With particular reference to FIG. 1 there is illustrated a partial plan view of the front-side of a conductive connector plate 10 on which is mounted the bus bar of the present invention. Connector plate 10 is, in the preferred embodiment, an aluminum sheet of approximately 0.08 inch thick having a plurality of holes 12 therethrough in which are inserted, or mounted on the front side, insulated pass-through female connectors 14. The connectors 14 on the front-side serve as mounting means for the male blades of a printed circuit board 8 connector which is mounted thereon while on the back-side serve as Wire-Wrap pins **14*a* for back panel wiring by the automated Wire-Wrap machine. The bus bars 16*a* and 16*b* are aligned along a respectively associated line of holes 12 for conforming to the center-to-center spacing of the pattern of holes 12 so as to conform to the dimensions of the male contacts of the printed circuit board 8 male connectors which are mounted thereon. At the end of the aligned holes 12 in plate 10 that are associated with each of bus bars 16*a* and 16*b* there is provided a hole 18 through which passes a tab that makes electrical contact with the tab of a conductive strip that is mounted on the back-side of plate 10. Additionally, plate 10 includes a plurality of mounting holes 20 and stiffening members 22** for adding structural rigidity thereto.

Figure 2:
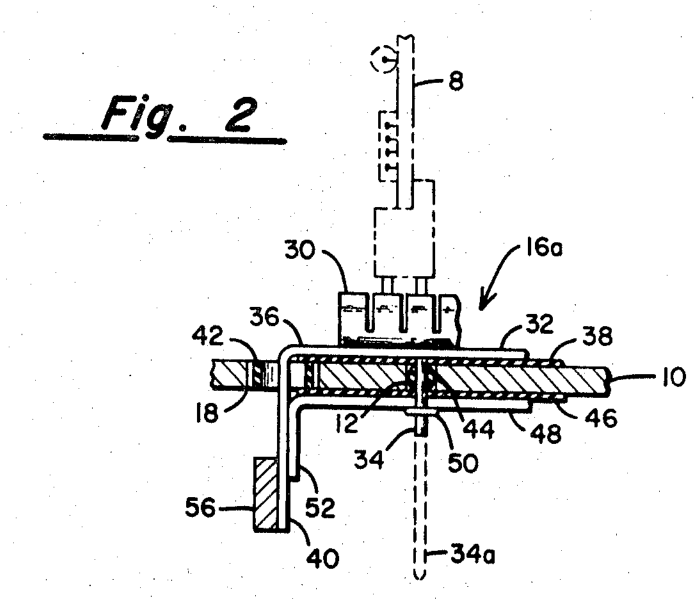
FIG. 2 is a cross section of the combination of FIG. 1 taken along line 2—2 showing the voltage bus arrangement of the present invention.

With particular reference to FIG. 2 there is presented a cross section of the combination of FIG. 1 taken along line 2—2 showing the voltage bus arrangement **16*a* of the present invention. The bus bar 16*a* on the connector plate 10 front-side, includes a continuous spring clip 30 that provides sliding pressure electrical contact with male contacts of the printed circuit board 8 connectors that are mounted thereby on the connector plate front-side. The continuous spring clip 30 is soldered to a first conductive strip 32 along its entire length for forming electrical and structural continuity therewith. Additionally, there are provided along the length of bus bar 16*a* a plurality of conductive members 34 that are solder brazed to spring clip 30 and strip 32** for forming a unitary member therewith.

In assembling bus bar **16*a* to plate 10 for the voltage bus arrangement, the unitary assembly 36, formed by spring clip 30, strip 32 and the conductive members 34, has an insulator strip 38 aligned along the conductive members 34 and the bottom surface of strip 32 for providing electrical insulation between it and conductive plate 10. Next, tab 40 of strip 32 is inserted into hole 18 of plate 10 while the plurality of conductive members 34 are passed through their correspondingly aligned holes 12 in plate 10. Then, insulating members 42 and 44 are inserted in their corresponding holes 18 and 12 of plate 10 for ensuring electrical insulation between tab 40 and conductive member 34, respectively, and conductive plate 10. Next, insulator strip 46 is aligned along the conductive members 34 on the back-side of plate 10. Next, a second conductive strip 48, having aligned holes therethrough conforming to the conductive members 34 of assembly 36, is placed over insulative strip 46 for the final assembly of bus bar 16*a* to plate 10. A soldering ring 50 is passed over each conductive member 34 with soldering ring 50 compressively securing strips 32 and 48 against plate 10. The elements of bus bar 16*a* and plate 10 are formed into an integral unit by the soldering of solder rings 50 to conductive members 34 and the soldering of tabs 52 of strip 48 to tabs 40 of strip 32. By this method the constituent elements of bus bar 16*a* are formed into an integral whole providing electrical continuity between conductive strips 32 and 48 at their end tabs 40 and 52, respectively, and along their lengths at conductive members 34 and the associated solder rings 50. Additionally, conductive members 34 may be of the same dimensions, as respect the back-side of plate 10, as Wire-Wrap pins 14*a* of connectors 14 whereby such conductive members 34 may be utilized as additional Wire-Wrap pins 34*a*. Mating tabs 40 and 52 may be utilized as an electrical terminal for a conductive strap 56 of a voltage bus distribution system that may intercouple a plurality of bus bars 16*a***.

Figure 3:
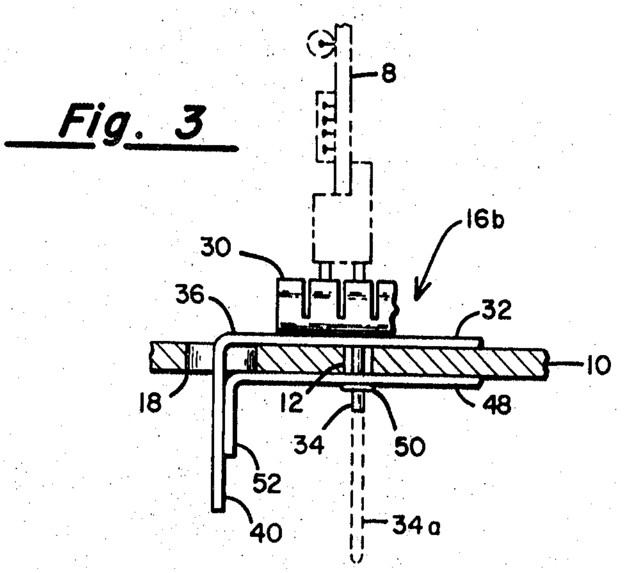
FIG. 3 is a cross section of the combination of FIG. 1 taken along line 3—3 showing the ground bus arrangement of the present invention.

With particular reference to FIG. 3 there is presented a cross section of the combination of FIG. 1 taken along line 3—3 showing the ground bus arrangement **16*b* of the present invention. As it is desirable to reduce the number of parts to a minimum, the conductive members of the voltage bus arrangement 16*a* illustrated in FIG. 2 are utilized in the ground bus arrangement 16*b* of FIG. 3. Accordingly, like component parts of the ground bus arrangement 16*b* of FIG. 3 as compared to the voltage bus arrangement 16*a* of FIG. 2 shall be identified by like reference numerals. The ground bus arrangement of FIG. 3 is substantially similar to the voltage bus arrangement of FIG. 2 except that the insulated members 38, 42, 44 and 46 utilized in the voltage bus arrangement of FIG. 2 are not utilized in the ground bus arrangement of FIG. 3. This is so as it is desirable that the bus bar 16*b* be in as intimate physical and electrical relationship with the conductive plate 10 as is possible. In this arrangement, the bus bar 16*b* and the plate 10** may be considered to be at the same, or ground, potential.

In assembling bus bar **16*b* to plate 10 for the ground bus arrangement, the unitary assembly 36 formed by spring clip 30, strip 32 and the conductive members 34 is located in the front-side of plate 10 in the same manner as associated with the voltage bus arrangement of FIG. 2. Without the use of any insulating members 38, 42, 44 or 46, as utilized in the voltage bus arrangement of FIG. 2, a second conductive strip 48, having aligned holes therethrough conforming to the conductive members 34 of assembly 36, is placed over the conductive members 34. A conductive element, or soldering ring, 50 is then passed over each conductive member 34 with soldering ring 50 compressively securing strips 32 and 48 against plate 10. The elements of bus bar 16*b* are then formed into an integral unit by the soldering of solder rings 50 to conductive members 34 and the soldering of tabs 52 of strip 48 to tabs 40 of strip 32. By this method the constituent elements of bus bar 16*b* are formed into an integral whole providing electrical continuity between conductive strips 32 and 48 on the front-side and back-side, respectively, of plate 10**.

Figure 4:
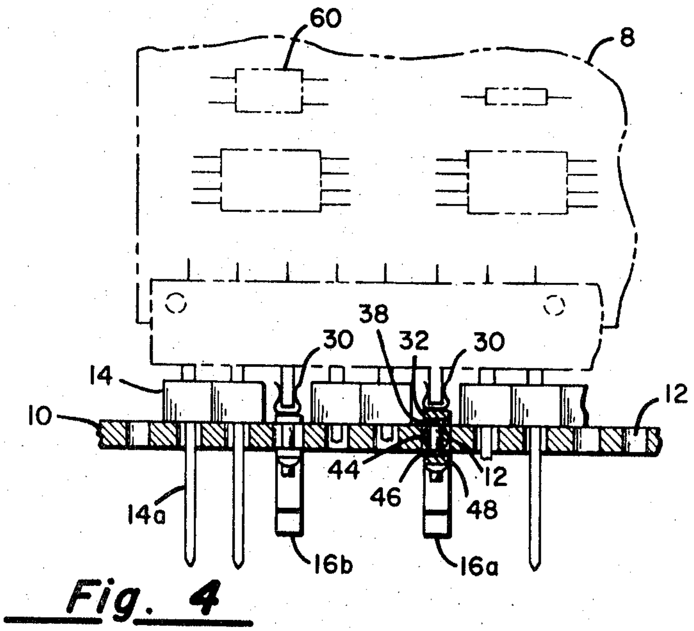
FIG. 4 is a cross section of the combination of FIG. 1 taken along line 4—4.

With particular reference to FIG. 4 there is presented a cross section of the combination of FIG. 1 taken along line 4—4 showing the voltage bus and ground bus arrangements of the present invention. This view shows that the top surfaces, i.e., those surfaces farthest removed from the front-side of plate 10, of female connectors 14 and the spring clips 30 of bus bars **16*a* and 16*b* are at substantially the same level whereby printed circuit board 8 may be properly oriented therein. FIG. 4 is particularly presented to illustrate the orientation and relationship of bus bars 16***a* and 16*b* with respect to connectors 14 along the center-to-center spacing established by the plurality of holes 12 in plate 10. FIG. 4 illustrates that bus bar 16*a* is substantially similar to bus bar 16*b* except that bus bar 16*a* includes the insulator members 32, 38, and 46 (and 42) that are required to provide the proper electrical isolation of bus bar 16*a* from conductive plate 10 which is required of the voltage bus arrangement 16*a*.

As is well known, the various voltage source busses, such as DC reference potentials, that are associated with typical printed circuit boards 8 are, due to the minimum spacing permitted, often adversely effected by deleterious noise signals that are capacitively and inductively coupled thereto. Accordingly, it has been prior art practice to provide on such printed circuit boards 8 one or more coupling capacitors 60 which couple deleterious noise signals in the voltage source busses to ground. By utilizing the present invention the need for such decoupling capacitors may be substantially reduced or altogether eliminated. With respect to FIG. 2 it can be seen that bus bar 16*a* includes two relatively large plates 32 and 48 that are insulatively mounted in close proximity to a ground plane 10, being separated therefrom by dielectric members 38 and 46, respectively. This voltage bus 16*a* arrangement thus comprises two capacitors; a first capacitor formed by plate 32, dielectric 38 and ground plane 10; and a second capacitor formed by plate 48, dielectric 46 and ground plane 10. By utilizing elements thereof of the proper materials and dimensions it has been determined by the applicant that sufficient capacitance may be built-in to such first and second capacitors to substantially reduce or eliminate the need for separate coupling capacitors 60 priorly required on printed circuit boards 8.

Thus, it is apparent that the applicants have provided a novel continuous bus bar for a conductive connector plate that is specifically designed for back panel wiring by an automatic Wire-Wrap machine. It is understood that suitable modifications may be made in the structure as disclosed provided such modifications come within the spirit and scope of the appended claims. Having now, therefore, fully illustrated and described our invention what we claim to be new and desire to protect by Letters Patent is set forth in the appended claims.

We claim:

1. In combination:

a conductive connector plate having a predetermined pattern of holes therethrough, said connector plate having a front-side and a back-side;

a continuous bus bar mounted on said connector plate, having;

on said front-side a continuous conductive spring clip and a first conductive strip electrically intercoupled along their length;

on said back-side a second conductive strip;

a plurality of conductive members spaced along said first conductive strip and passing through predetermined ones of the holes in said connector plate for making electrical contact with said second conductive strip;

said first and second conductive strips having mating tabs at at least one end for forming electrical intercoupling thereat; and, said conductive members and said mating tabs causing said continuous spring clip and said first conductive strip on said front-side and said second conductive strip on said back-side to function as a unitary bus bar.

2. The combination of claim 1 wherein said continuous bus bar is conductively mounted on said connector plate for causing said continuous bus bar and said connector plate to be at substantially the same potential.

3. The combination of claim 1 wherein certain of said conductive members form wire-wrap pins on said back-side.

4. The combination of claim 1 further including insulative means for insulatively mounting said continuous bus bar on said connector plate for permitting said continuous bus bar and said connector plate to be at substantially different potentials.

5. The combination of claim 4 wherein said insulative means includes two relatively thin insulating strips, one each insulating said first conductive strip and said second conductive strip, respectively, from said connector plate for functioning as the dielectric material of first and second capacitors formed by the first and second conductive strips and the connector plate.

6. The combination of claim 5 wherein said first and second capacitors are of a sufficient capacity to effectively function as coupling capacitors between the bus bar and the connector plate.

7. The combination of claim 1 further including a plurality of conductive elements, one each being associated with each of said conductive members.

8. The combination of claim 7 wherein said conductive elements are solder rings that are soldered to the associated conductive member and to the second conductive strip for compressively securing said first and second conductive strips about said connector plate.

9. The combination of claim 8 further including insulative means for insulatively mounting said bus bar on said connector plate.

10. The combination of claim 9 wherein said mating tabs are soldered together forming a terminal for a voltage bus distribution system.

References Cited

UNITED STATES PATENTS

| | | | |
|---|---|---|---|
| 3,147,404 | 9/1964 | Sinner | 317—101 |
| 3,389,306 | 6/1968 | Schmidt et al. | 317—101 |

ROBERT K. SCHAEFER, Primary Examiner

D. SMITH, Jr., Assistant Examiner

U.S. Cl. X.R.

339—17